United States Patent
Liu et al.

(10) Patent No.: US 10,102,328 B1
(45) Date of Patent: Oct. 16, 2018

(54) SYSTEM AND METHOD FOR CONSTRUCTING SPANNING TREES

(71) Applicant: Cadence Design Systems, Inc., San Jose, CA (US)

(72) Inventors: Wen-Hao Liu, Austin, TX (US); Zhuo Li, Cedar Park, TX (US); Charles Jay Alpert, Cedar Park, TX (US); Mehmet Can Yildiz, Austin, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 146 days.

(21) Appl. No.: 15/060,020

(22) Filed: Mar. 3, 2016

(51) Int. Cl.
*G06F 17/50* (2006.01)

(52) U.S. Cl.
CPC .............................. *G06F 17/5077* (2013.01)

(58) Field of Classification Search
CPC .................................................. G06F 17/5077
See application file for complete search history.

(56) References Cited

U.S. PATENT DOCUMENTS

| | | | | |
|---|---|---|---|---|
| 7,725,863 | B2 * | 5/2010 | Mayer | G06F 17/5077 716/126 |
| 8,108,818 | B2 | 1/2012 | Sze et al. | |

OTHER PUBLICATIONS

Alpert et al., "Timing-Driven Steiner Trees are (Practically) Free," Proc. Design Automation Conference 2006, San Francisco, CA, pp. 389-392 (Jul. 24-28, 2006).
Zhou et al., "Efficient Minimum Spanning Tree Construction Without Delaunay Triangulation," Design Automation conference 2001, Asia and South Pacific, pp. 192-197 (2001).
Alpert et al., "Prim-Dijkstra Tradeoffs for Improved Performance-Driven Routing Tree Design," IEEE Transactions on Computer—Aided Design of Integrated Circuits and Systems, 14(7), pp. 890-896 (Jul. 1995).

* cited by examiner

*Primary Examiner* — Vuthe Siek
(74) *Attorney, Agent, or Firm* — Mark H. Whittenberger, Esq.; Holland & Knight LLP

(57) ABSTRACT

The present disclosure relates to a system and method for constructing spanning trees. Embodiments may include receiving, using at least one processor, a plurality of nodes associated with the integrated circuit design. In some embodiments, the plurality of node may be configured to be intercoupled by one or more combinations of edges. Embodiments may further include receiving a user-defined value at a graphical user interface. Embodiments may also include generating a routing graph with a subset of the one or more combinations of edges based upon, at least in part, the user-defined value and the position of each of the plurality of nodes. Embodiments may further include generating a spanning tree based upon, at least in part, at least one of: one or more wirelengths of the routing graph and one or more source-sink detour costs associated with the routing graph.

17 Claims, 14 Drawing Sheets

SYSTEM AND METHOD FOR CONSTRUCTING SPANNING TREES

FIELD OF THE INVENTION

The present disclosure relates to electronic design automation (EDA), and more specifically, to a system and method for constructing spanning trees.

DISCUSSION OF THE RELATED ART

EDA utilizes software tools that may be used in the design and analysis of numerous electronic systems such as printed circuit boards (PCBs) and integrated circuits (ICs). Spanning trees may be used in determining a wire routing between many nodes or pins for PCBs and ICs. A Prim-Dijkstra (PD) algorithm can generate a spanning tree. The time complexity of the PD algorithm is (e log e), where e is the number of edges in a given routing graph associated with the spanning tree. However, the number of edges in a given routing graph is often at least the number of nodes squared. As the number of nodes increases, the time complexity of the PD algorithm increases significantly. It may be of interest to seek a spanning tree construction process to more quickly obtain better spanning trees that consider both wirelength and/or source-sink detour costs from a routing graph with fewer edges.

SUMMARY OF INVENTION

In one or more embodiments of the present disclosure, a computer-implemented method is provided. The method may include receiving, using at least one processor, a plurality of nodes associated with the integrated circuit design. In some embodiments, the plurality of node may be configured to be intercoupled by one or more combinations of edges. The method may further include receiving a user-defined value at a graphical user interface. The method may also include generating a routing graph with a subset of the one or more combinations of edges based upon, at least in part, the user-defined value and the position of each of the plurality of nodes. The method may further include generating a spanning tree based upon, at least in part, at least one of: one or more wirelengths of the routing graph and one or more source-sink detour costs associated with the routing graph.

One or more of the following features may be included. In some embodiments, the routing graph may be one or more of a minimum spanning tree graph, a convex-hull graph, a partial convex-hull graph, and a minimum wirelength shortest path tree (MW-SPT). In some embodiments, the routing graph may be the convex-hull graph when the user-defined value is greater than the number of the plurality of nodes and may be one or more of: the minimum spanning tree graph, the partial convex-hull graph, and the MW-SPT when the user-defined value is less than or equal to the number of the plurality of nodes. The method may further include receiving a user-specified floating parameter from a graphical user interface. In some embodiments, generating the spanning tree may be further based upon, at least in part, the user-specified floating parameter.

In some embodiments, the subset of the one or more combinations of edges may have fewer edges than the number of the plurality of nodes squared. In some embodiments, the spanning tree may have a time complexity of less than or equal to O(n log n). In some embodiments, the spanning tree may be a minimum wirelength shortest path tree.

In one or more embodiments of the present disclosure, a system may include a computing device having at least one processor configured to receive a plurality of nodes associated with the integrated circuit design, receive a user-defined value at a graphical user interface, generate a routing graph with a subset of the one or more combinations of edges based upon, at least in part, the user-defined value and the position of each of the plurality of nodes, and generate a spanning tree based upon, at least in part, at least one of: one or more wirelengths of the routing graph and one or more source-sink detour costs associated with the routing graph.

One or more of the following features may be included. In some embodiments, the plurality of nodes may be configured to be intercoupled by one or more combinations of edges. In some embodiments, the routing graph may be one or more of a minimum spanning tree graph, a convex-hull graph, a partial convex-hull graph, and a MW-SPT. In some embodiments, the routing graph is a MW-SPT. In some embodiments, the routing graph may be a convex-hull graph when the user-defined value is greater than the number of the plurality of nodes and may be one or more of: the minimum spanning tree graph, the partial convex-hull graph, and the MW-SPT when the user-defined value is less than or equal to the number of the plurality of nodes.

The system may also include at least one processor configured to receive a user-specified floating parameter from a graphical user interface. In some embodiments, the spanning tree may be further based upon, at least in part, the user-specified floating parameter. In some embodiments, the one or more combinations of edges may have fewer edges than the number of the plurality of nodes squared. In some embodiments, the spanning tree may have a time complexity of less than or equal to O(n log n). In some embodiments, the spanning tree may be a minimum wirelength shortest path tree.

In one or more embodiments of the present disclosure, another computer-implemented method is provided. The method may include receiving, using at least one processor, a plurality of nodes associated with the integrated circuit design. In some embodiments, the plurality of nodes may be configured to be intercoupled by one or more combinations of edges. The method may also include receiving a user-defined value and generating a routing graph with a subset of the one or more combinations of edges based upon, at least in part, the user-defined value and the position of each of the plurality of nodes. The method may further include generating a spanning tree based upon, at least in part, the routing graph.

One or more of the following features may be included. In some embodiments, the routing graph may be one or more of a minimum spanning tree graph, a convex-hull graph, a partial convex-hull graph, and a MW-SPT. In some embodiments, generating the spanning tree may be further based upon, at least in part, at least one of: one or more wirelengths of the routing graph and one or more source-sink detour costs associated with the routing graph.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

Figure 1:
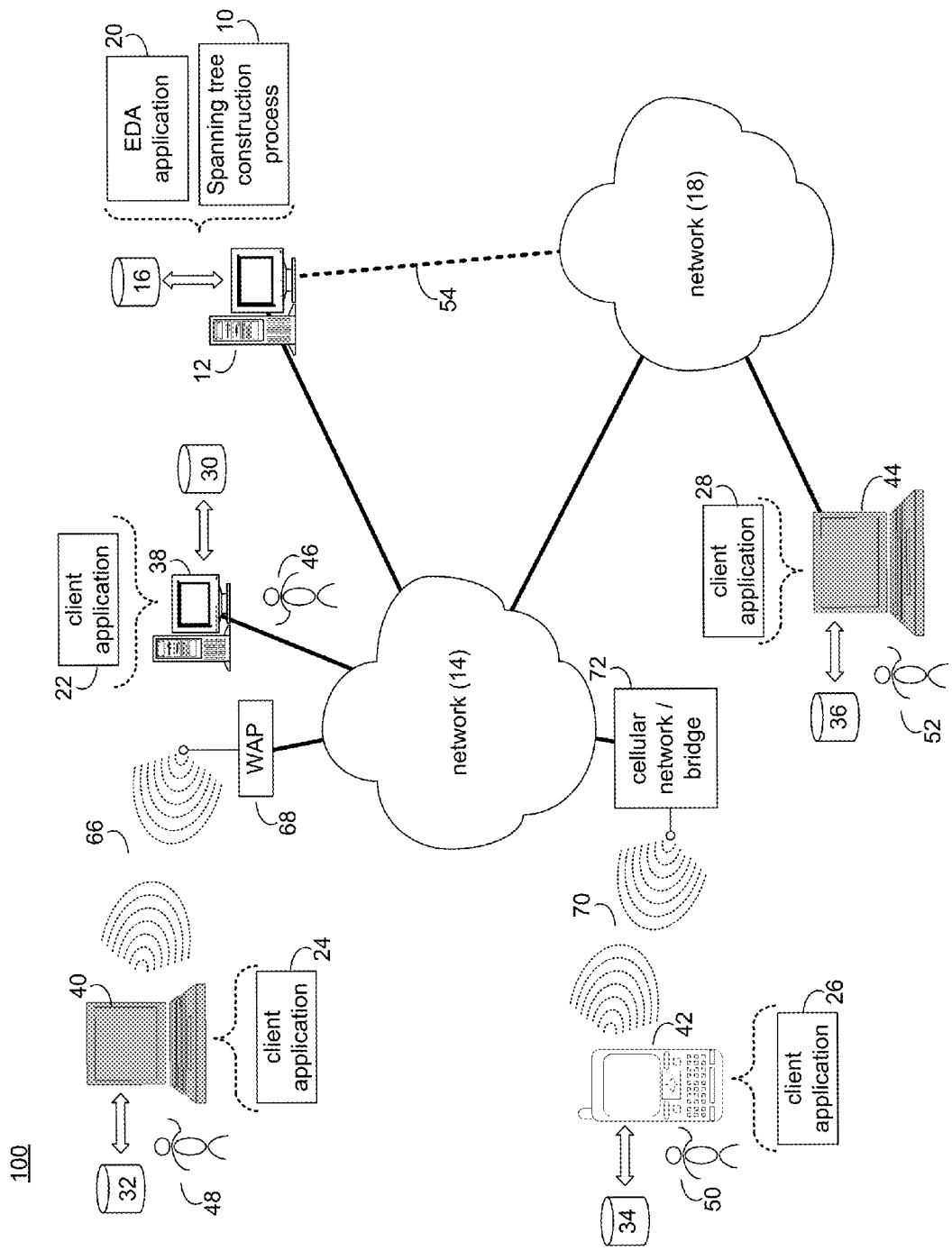
FIG. 1 is a system diagram depicting aspects of the spanning tree construction process in accordance with an embodiment of the present disclosure.

Referring to FIG. 1, there is shown spanning tree construction process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, the spanning tree construction process may reside on and be executed, in whole or in part, by a client electronic device, such as a personal computer, notebook computer, personal digital assistant, or the like.

The instruction sets and subroutines of spanning tree construction process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (i.e., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28). EDA application 20 may be referred to herein as a design tool.

Spanning tree construction process 10 may be a standalone application, or may be an applet/application/script that may interact with and/or be executed within EDA application 20. In addition/as an alternative to being a server-side process, the spanning tree construction process may be a client-side process (not shown) that may reside on a client electronic device (described below) and may interact with an EDA client application (e.g., one or more of EDA client applications 22, 24, 26, 28). Further, the spanning tree construction process may be a hybrid server-side/client-side process that may interact with EDA application 20 and an EDA client application (e.g., one or more of client applications 22, 24, 26, 28). As such, the spanning tree construction process may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize spanning tree construction process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (i.e., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (i.e., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (i.e., CSMA/CA) for path sharing. The various 802.11x specifications may use phase-shift keying (i.e., PSK) modulation or complementary code keying (i.e., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both).

Figure 2:
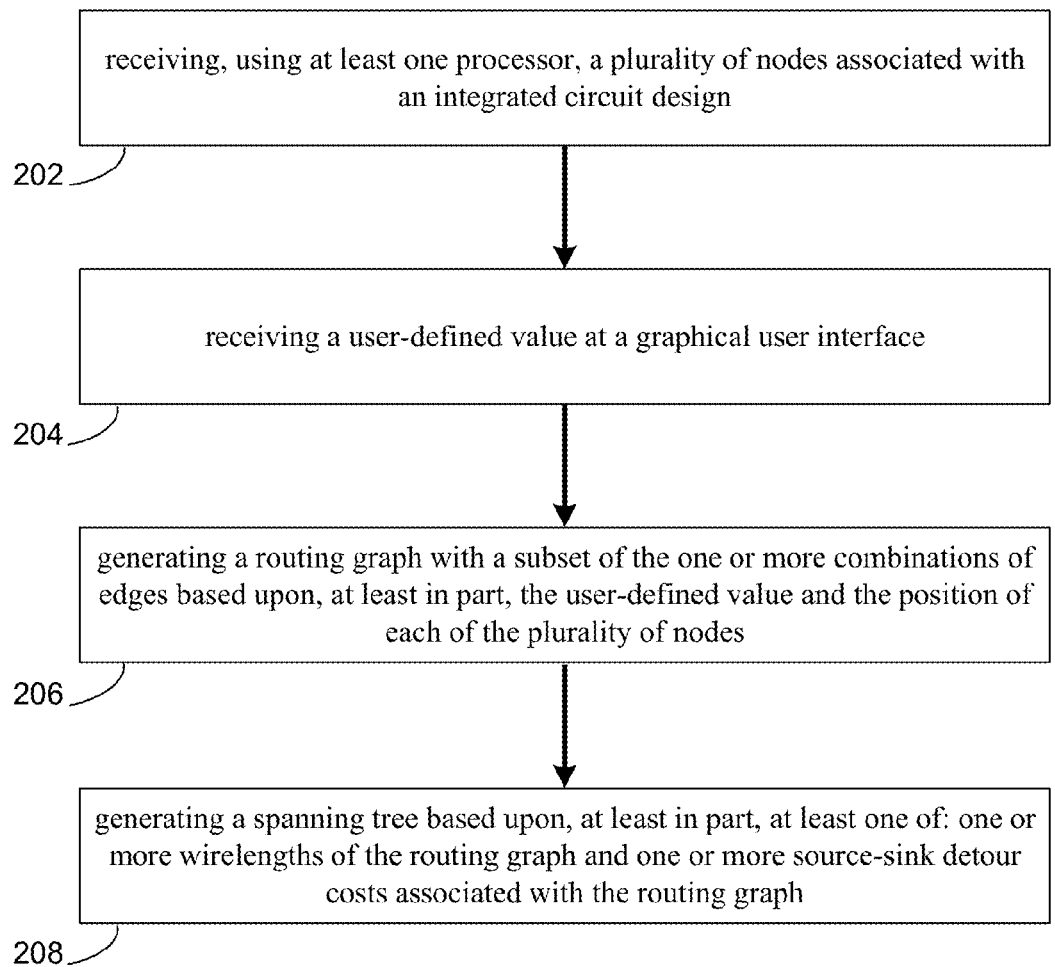
FIG. 2 is a flowchart depicting operations consistent with the spanning tree construction process of the present disclosure.

Referring to FIGS. 2-14B, various embodiments consistent with spanning tree construction process 10 are provided. As shown in FIG. 2, embodiments of spanning tree construction process 10 may include receiving (202), using at least one processor, a plurality of nodes associated with the integrated circuit design. Embodiments may further include receiving (204) a user-defined value at a graphical user interface. Embodiments may also include generating (206) a routing graph with a subset of the one or more combinations of edges based upon, at least in part, the user-defined value and the position of each of the plurality of nodes. Embodiments may further include generating (208) a spanning tree based upon, at least in part, at least one of: one or more wirelengths of the routing graph and one or more source-sink detour costs associated with the routing graph.

Figure 3:
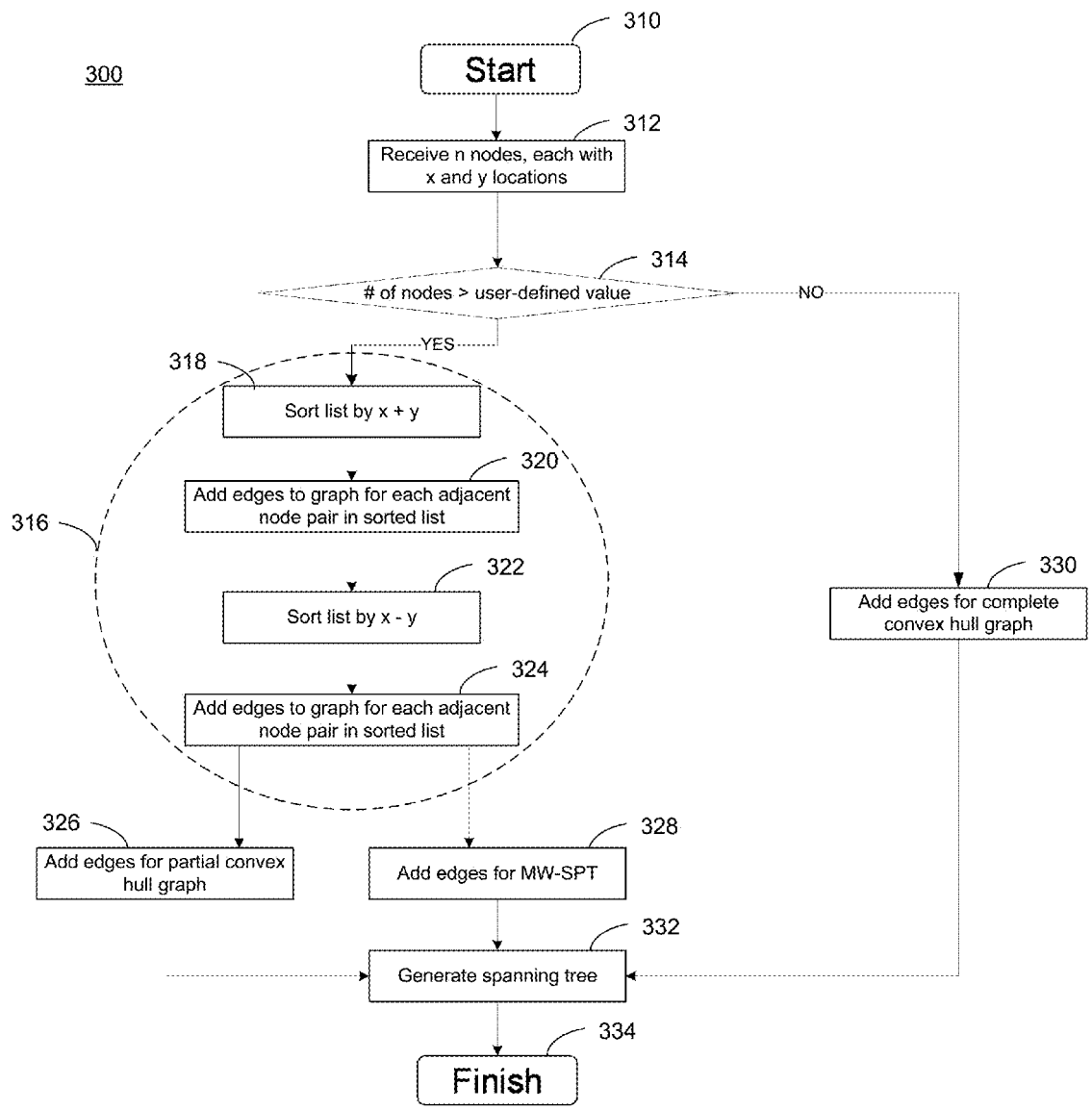
FIG. 3 is a flowchart depicting operations consistent with the spanning tree construction process of the present disclosure.

In some embodiments, and as shown in the example flowchart of FIG. 3, spanning tree construction process 10 may start 310 by receiving 312, using at least one processor, a plurality of nodes. As will be discussed in greater detail below, each node may have "x" and "y" locations and/or coordinates relative to one or more nodes. Spanning tree construction process 10 may compare 314 a user-defined value to the number of nodes. In some embodiments, spanning tree construction process 10 may generate one or more routing graphs, based upon at least in part the user-defined value. In some embodiments, spanning tree construction process 10 may generate 316 a minimum spanning tree graph. As will be discussed in greater detail below, generating a minimum spanning tree graph may include, but is not limited to, sorting 318 the nodes by "x+y", adding 320 edges to the routing graph for each adjacent node pair in the sorted list of nodes, sorting 322 the nodes by "x-y", and adding 324 edges to the routing graph for each adjacent node pair in the sorted list of nodes.

In some embodiments, spanning tree construction process 10 may include generating 326 a partial convex hull graph and/or adding edges for a partial convex hull graph. Additionally and/or alternatively, spanning tree construction process 10 may include generating 328 a minimum wirelength shortest path tree (MW-SPT) and/or adding edges for a MW-SPT. Embodiments may include generating 330 a complete convex hull graph and/or adding edges for a complete convex hull graph. In some embodiments, spanning tree construction process 10 may include generating 332 a spanning tree based upon, at least in part, the routing graph and spanning tree construction process 10 may finish 334.

Figure 4A:
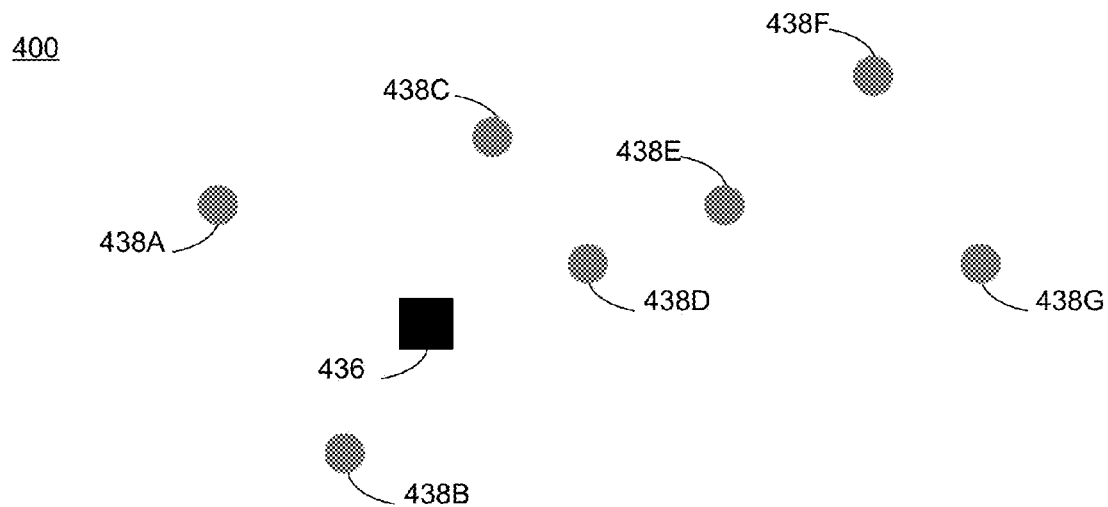
FIG. 4A is a schematic depicting a plurality of nodes in accordance with an embodiment of the present disclosure.
Figure 4B:
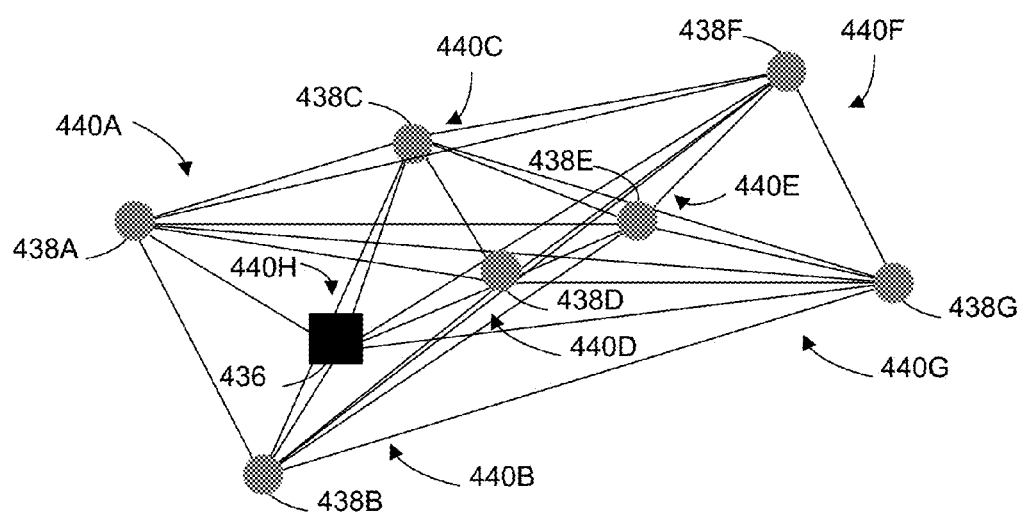
FIG. 4B is a schematic depicting a routing graph in accordance with an embodiment of the present disclosure.

In some embodiments and as shown in FIGS. 4A and 4B, spanning tree construction process 10 may include receiving a plurality of nodes or pins associated with an integrated circuit. In some embodiments, the plurality of nodes may be configured to be intercoupled. "Intercoupled" as used herein may include, but is not limited to, interconnected and/or being connected together. The plurality of nodes may include sources and sinks. A "source" as used herein may include, but is not limited to, a source node, source pin and/or a root. A "sink" as used herein may include, but is not limited to, a vertex, a terminal, a pin, and/or a node. An "edge" or "edge (a, b)" as used herein may include, but is not limited to, a feasible and/or potential intercoupling between two nodes (e.g., sink "a" and sink "b"). For example, source A might route and/or intercouple to sink B, and sink B might route and/or intercouple to sink C. In some embodiments, the plurality of nodes may define a high-fanout net. A "high-fanout net" as used herein may include, but is not limited to, a plurality of nodes that connect to a single source. An example of a high-fanout net may be a "clock net" or all the loads (e.g., plurality of nodes) on the output of a clock circuit (e.g., source).

As will be discussed in greater detail below, the plurality of nodes may be configured to be intercoupled by edges or by one or more combinations of edges to generate a routing graph. A "routing graph" as used herein may include, but is not limited to, an intermediate data structure that may be used to create and/or evaluate a spanning tree, as will be described in greater detail below. A "spanning tree" as used herein may include, but is not limited to, one or more possible interconnections between a plurality of nodes in a network and/or a signal net. While a network may include the interconnection and/or communication of a plurality electronic devices (e.g., wired connections, wireless connections, etc.), this is a non-limiting example within the scope of the present disclosure. A network may also include the relationship(s) between various mathematical structures and/or symbols. Examples of networks that may be represented by a spanning tree include, but are not limited to, communication networks, power networks (e.g., electrical transmission), utility networks (e.g., liquid piping), and other networks of information and/or resources that may be represented by a spanning tree.

In one example, a spanning tree may be associated with an integrated circuit design. The spanning tree may describe how the plurality of nodes connects both directly and/or indirectly to a source node in the integrated circuit design. However, the spanning tree itself may not be a routed solution. A spanning tree may provide a starting point from which actual wires may be inserted. In some embodiments, the spanning tree may be associated with a VLSI circuit routing design. The spanning tree may determine the topology for the wiring of one or more given points in an electronic circuit design based upon, at least in part, a routing graph.

In some embodiments, spanning tree construction process 10 may include receiving a user-defined value at a graphical user interface. In some embodiments, the user-defined value may be received from a graphical user interface (GUI). In some embodiments the user-defined value may be any value in the range of zero to the number of pins. Additionally and/or alternatively, a default user-defined value may be stored in spanning tree construction process 10. As will be discussed in greater detail below, the user-defined value may be used, at least in part, to generate a routing graph.

As discussed above, a "routing graph" may include, but is not limited to, an intermediate data structure that may be used to create and/or evaluate a spanning tree. A routing graph may depict multiple, possible intercoupling combinations between a plurality of nodes. A complete or full routing graph may include all possible combinations of edges to intercouple the plurality of nodes. In some embodiments, the complete routing graph may be used to generate a spanning tree.

In one example and as shown in FIG. 4A, eight nodes (a source 436 and sinks 438A, 438B, 438C, 438D, 438E, 438F, and 438G) may be received. In FIG. 4A the source 436 may be represented as a black square and the one or more sinks 438A, 438B, 438C, 438D, 438E, 438F, and 438G may be represented as green dots and/or circles. In a complete routing graph, each node may be intercoupled with every other node in the plurality of nodes. To generate this exemplary routing graph, "$n^2$" or 64 edges may be used, where n may be the number of nodes in the plurality of nodes. As shown in the example of FIG. 4B, the routing graph may include a source 436, one or more sinks 438A, 438B, 438C, 438D, 438E, 438F, and 438G and one or more edges and/or groups of edges 440A, 440B, 440C, 440D, 440E, 440F, 440G, and 440H to link the one or more sinks 438A, 438B, 438C, 438D, 438E, 438F, and 438G and/or the source 436 (represented as lines between the source and the one or more sinks). The routing graph depicted in FIG. 4B may represent a complete routing graph because each node is intercoupled with each other node.

In some embodiments and as will be discussed in greater detail below, a spanning tree may be generated based upon, at least in part, a routing graph. A complete routing tree may include all possible edges or connections between each of the plurality of nodes. In some embodiments, the time complexity of a spanning tree may be defined as O(e log e) where e may be the number of edges in the routing graph. More edges may result in a higher time complexity for a spanning tree. However, as will be discussed in greater detail below, spanning tree construction process 10 may use a subset of the one or more combinations of edges to reduce the solution space of a routing tree and to construct a wirelength/source-sink detour cost balancing spanning tree in a fraction of the time normally required with a complete routing tree.

In some embodiments, spanning tree construction process 10 may include generating a routing graph with a subset of the one or more combinations of edges based upon, at least in part, the user-defined value and the position of each of the plurality of nodes. In other words, spanning tree construction process 10 may generate a routing graph with fewer edges or a subset of the one or more combinations of edges. A "subset" as used herein may include, but is not limited to, a combination of edges with at least one edge less than the total number of edges from all combinations of the plurality of nodes. In some embodiments, the subset may include n edges, where n is the number of nodes in the plurality of nodes. The position of each of the plurality of nodes may include, but is not limited to, the x-coordinate and y-coordinate of each node relative one or more other nodes. In some embodiments, the position of each node of the plurality of nodes may be described on a Cartesian plane. The Cartesian plane may originate from any node of the plurality of nodes. In some embodiments, the source may be the origin of the Cartesian plane. While the Cartesian coordinate system has been discussed, any other coordinate system is within the scope of the present disclosure.

In some embodiments, the routing graph may include one or more of a minimum spanning tree graph, a convex-hull graph, a partial convex-hull graph, and a minimum wirelength shortest path tree (MW-SPT).

Figure 5:
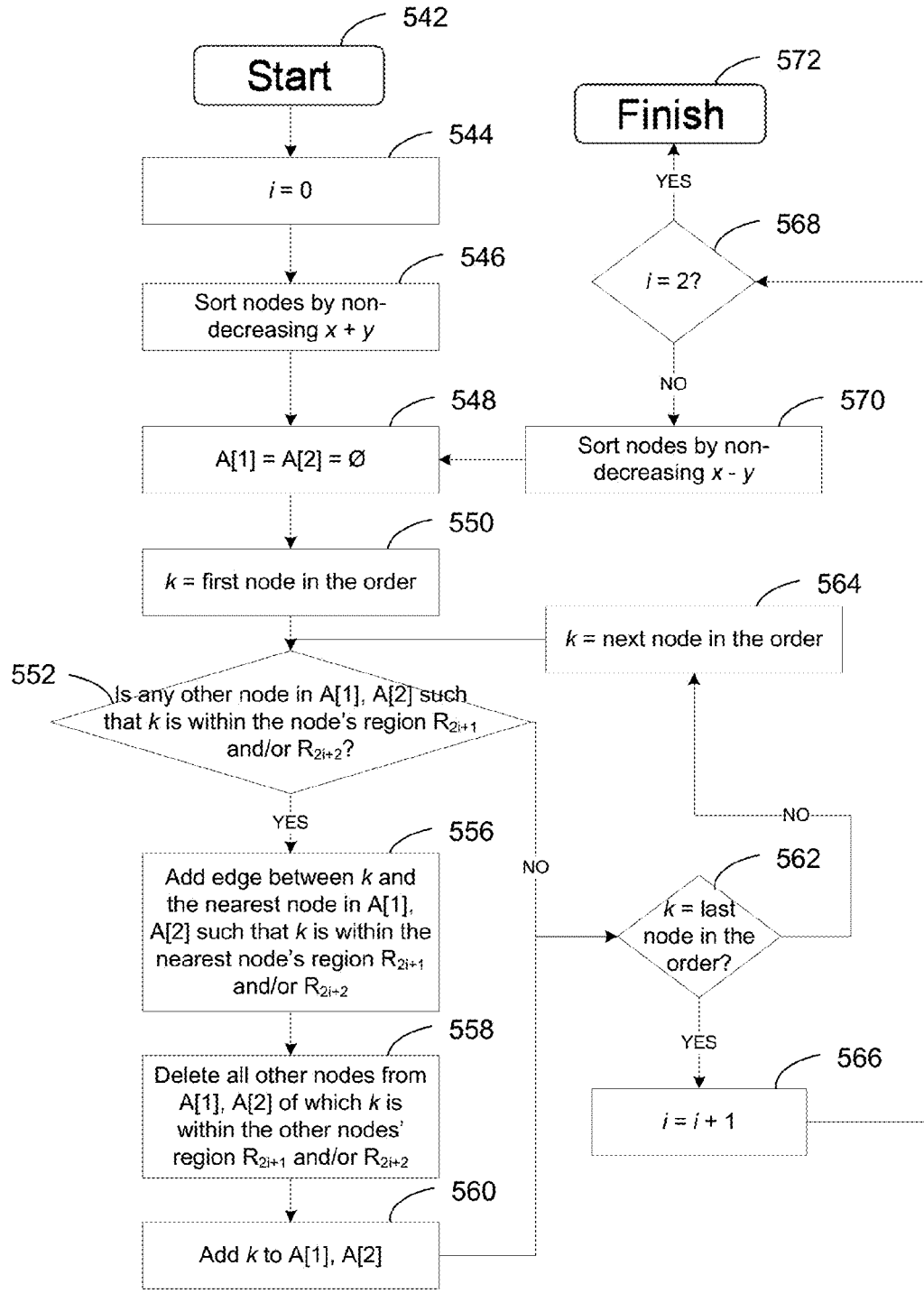
FIG. 5 is a flowchart depicting operations consistent with the spanning tree construction process of the present disclosure.

In some embodiments, and as shown in the example flowchart of FIG. 5, spanning tree construction process 10 may generate a minimum spanning tree graph. A "minimum spanning tree graph" as used herein may include, but is not limited to, a routing graph with minimal wirelength. As will be discussed in greater detail below, wirelength may include the distance between one or more nodes. An example function 500 of spanning tree construction process 10 may start 542 and initialize 544 a variable "i" to zero or "i=0".

Function 500 may sort 546 the plurality of nodes in a non-decreasing order according to "x+y" where x is the x-coordinate of a node and y is the y-coordinate of a node as defined on a Cartesian plane. Function 500 may reset 548 active sets A[1] and A[2] to ∅. Function 500 initialize k as the first node in the order of nodes. Function 500 may determine 552 whether there are other nodes in A[1] and A[2] such that k is in the other node's region $R_{2i+1}$ and/or $R_{2i+2}$.

Figure 6:
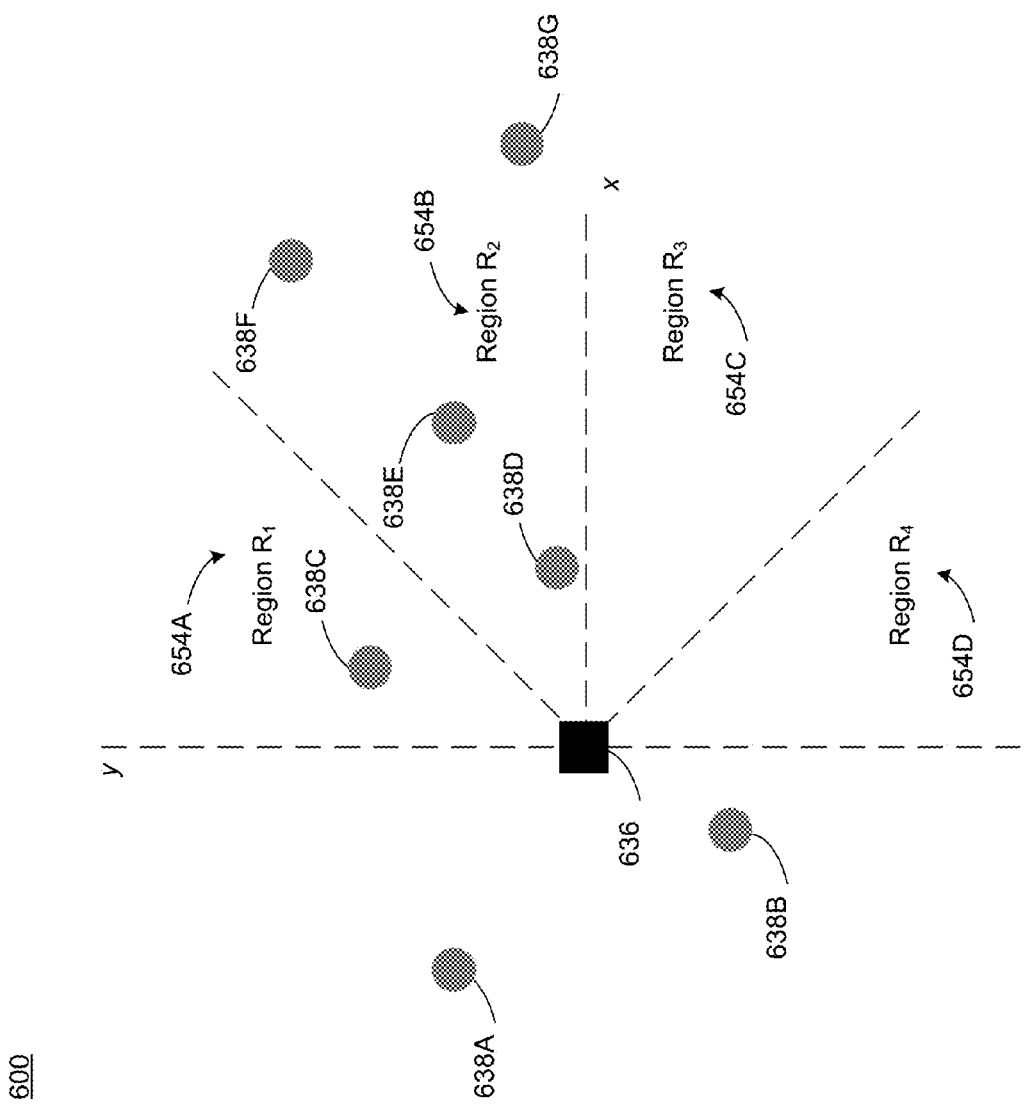
FIG. 6 is a schematic depicting a routing graph in accordance with an embodiment of the present disclosure.

Referring also to FIG. 6, a routing graph may include one or more regions. For example, Regions $R_1$ 654A, $R_2$ 654B, $R_3$ 654C, and $R_4$ 654D may be defined relative to one or more nodes. In the example of FIG. 6, the source 636 is defined as the center and/or origin of the Cartesian graph, however, any node may be selected as the origin. Every other node may be separated from the source 636 by one or more x-coordinates and y-coordinates as defined by the x-axis and the y-axis. For example, based on the x-coordinates and/or the y-coordinates of each node, node 638C may be located in the source's 636 Region $R_1$ 654A while nodes 638D, 638E, 638F, and 638G may be located in the source's 636 Region $R_2$ 654B. In some embodiments, each node may have a unique coordinate system from which other nodes may be evaluated to determine which region each other node is located in. While particular regions have been discussed and shown, any other region(s) and/or area(s) are within the scope of the present disclosure.

In some embodiments, when other nodes are identified by action 552, an edge may be added 556 between k and the nearest of the nodes identified by action 552. Function 500 may delete 558 the nodes identified by action 552 and add 560 k to A[1] and/or A[2]. Function 500 may determine 562 if k is the last node in the order. If k is not the last node in the order, k may be redefined 564 as the next node in the order. If k is the last node in the order, the variable i may be incremented 566 by one. Function 500 may determine 568 if i equals two. If i does not equal two, the nodes may be re-sorted 570 in a non-decreasing order according to "x-y". If i equals two, the function may finish 572.

Figure 7:
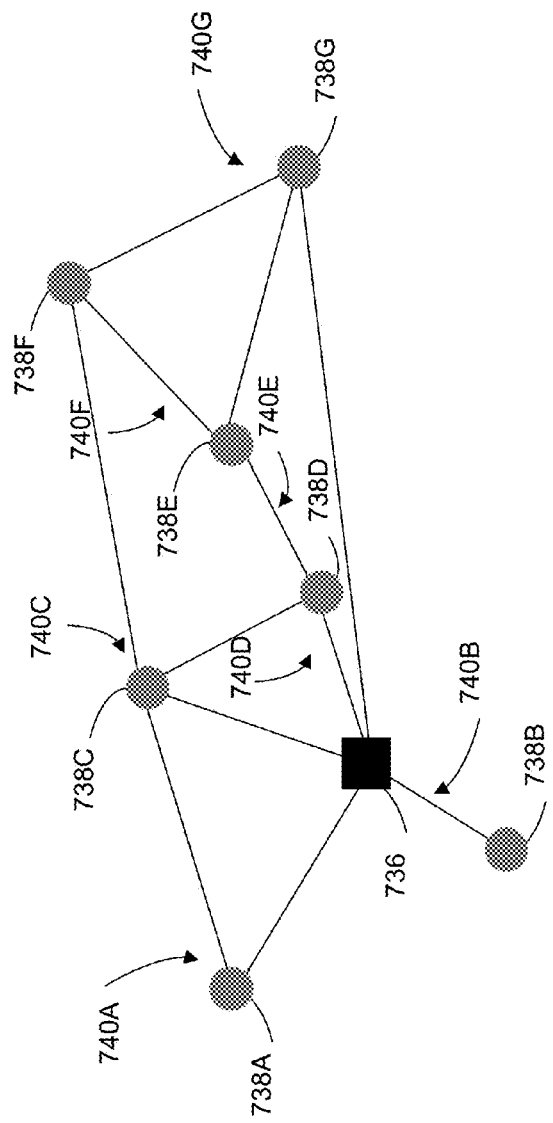
FIG. 7 is a schematic depicting a routing graph in accordance with an embodiment of the present disclosure.

An exemplary minimum spanning tree graph is shown in FIG. 7. For more information about minimum spanning tree graphs, see H. Zhou et al, "Efficient minimum spanning tree construction without Delaunay triangulation," TCAD 1995.

The following is a non-limiting example of an implementation of one or more features and/or functions of spanning tree construction process 10 for generating a minimum spanning tree graph. Other implementations may be used within the scope of the present disclosure.

For (i=0; i<2; i++) {
  If(i==0) sort points according to x+y;
  Else sort points according to x-y;
  A[1]=A[2]=∅
  For each point p in the order {
  Find points in A[1], A[2] such that p is in their $R_{2i+1}$ and $R_{2i+2}$ regions, respectively;
  Connect p with the nearest point in each subset;
  Delete the subsets from A[1], A[2], respectively;
  Add p to A[1], A[2];
  }
}

Figure 8:
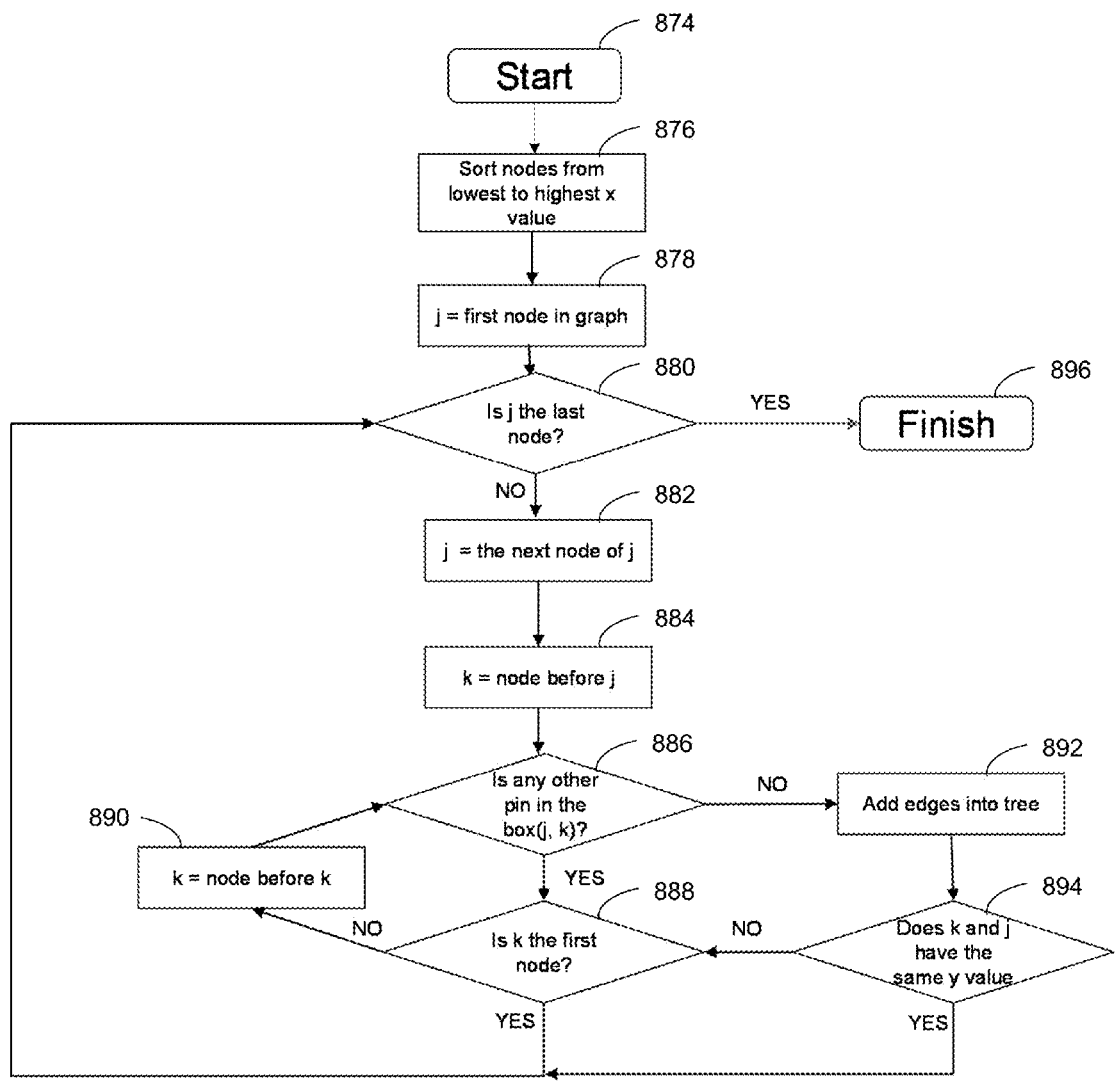
FIG. 8 is a flowchart depicting operations consistent with the spanning tree construction process of the present disclosure.

In some embodiments, and as shown in the example flowchart of FIG. 8, spanning tree construction process 10 may generate a complete convex-hull graph. A "complete convex-hull graph" as used herein may include, but is not limited to, a routing graph where an edge between two nodes (e.g., p, q) exists only if there is no node (e.g., v) such that the rectilinear distance between p and v (e.g., Manh(p, v)) and the rectilinear distance between q and v (e.g., Manh(q, v)) equals the rectilinear distance between p and q (e.g., Manh(p, q)). A convex-hull graph may include fewer edges than a complete routing graph. In some embodiments, the complete convex-hull graph and the complete routing graph may provide the same solution space for generating the spanning tree. In some embodiments, a complete convex-hull graph may include the shortest path.

Figure 9:
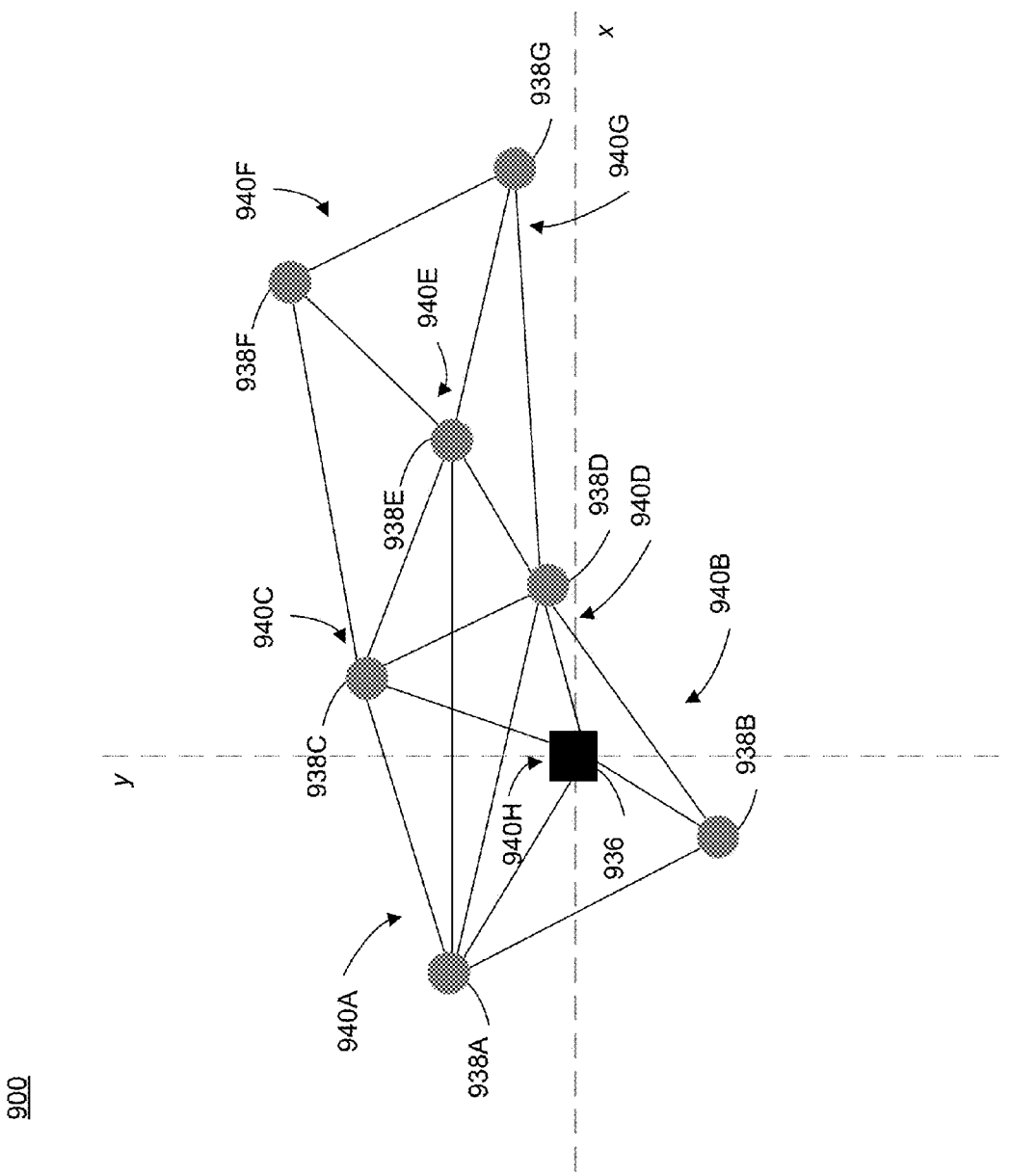
FIG. 9 is a schematic depicting a routing graph in accordance with an embodiment of the present disclosure.

An example function 800 of spanning tree construction process 10 may start 874 and sort 876 the plurality of nodes from a lowest x value to a highest x value. In some embodiments, the x-value may be determined by the x-coordinate of each node. Referring also to FIG. 9, a Cartesian plane may be defined with an origin at the source 936. Function 800 may define 878 j as the first node in the order of nodes.

Function 800 may determine 880 if j is the last node. If j is not the last node, j may be redefined 882 to be the next node in the order of nodes. Function 800 may define 884 k to be the node before j in the order of nodes. Function 800 may determine 886 if there are any other nodes in a "box" or area defined between nodes j and k. If there are nodes in the box defined between nodes j and k, function 800 may determine 888 if k is the first node in the order of nodes. If k is the first node, function 800 may continue from action 880. If k is not the first node, k may be redefined 890 as the node before the current node k. Function 800 may recursively determine 886 if other are nodes in the box defined between nodes j and k until there no other nodes.

Once there are no other nodes in the box between j and k, function 800 may add 892 one or more edges between nodes j and k. Function 800 may determine 894 if k and j have the same y-coordinate value. If not, function 800 may continue from action 888. If k and j have the same y-coordinate value, function 800 may continue from action 882. If j is the last node in the order of nodes, the function may finish 896. An exemplary complete convex-hull graph is shown in FIG. 9.

The following is a non-limiting example of an implementation of one or more features and/or functions of spanning tree construction process 10 for generating a complete convex-hull graph. Other implementations may be used within the scope of the present disclosure.

Figure 10:
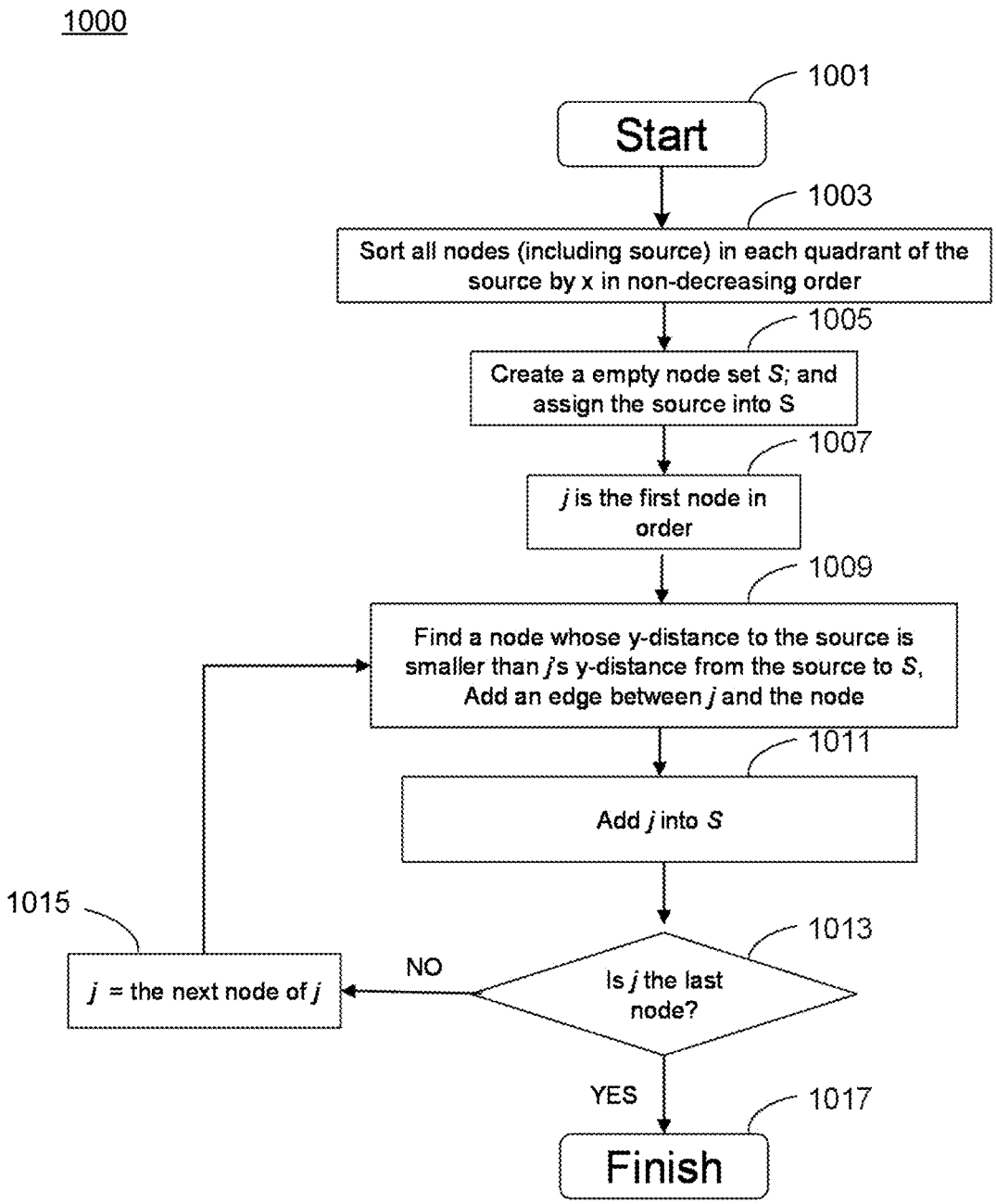
FIG. 10 is a flowchart depicting operations consistent with the spanning tree construction process of the present disclosure.

Sort all nodes by x-axis in a non-decreasing order
For int i from 2 to n
  int maxY=a number that is greater than the y-coordinate of any node received
  int minY=a number that is less than the y-coordinate of any node received
  For int j from i−1 to 1
    If(pj.y==pi.y)
      Create edge(pj, pi)
      Break
    Else if (pj.y>pi.y && pj.y<maxY)
      maxY=pj.y
      Create edge(pj, pi)
    Else if (pj.y<pi.y && pj.y>minY)
      minY=pj.y
      Create edge(pj, pi)
    End if
  End For
End For In some embodiments, and as shown in the example flowchart of FIG. 10, spanning tree construction process 10 may generate a partial convex-hull graph. A "partial convex-hull graph" as used herein may include, but is not limited to, a routing graph where each node, except the source, has an outgoing edge toward the source. In some embodiments, a partial convex-hull graph may have a time-complexity of O(n log n) and may generate O(n) edges. In some embodiments, a partial convex-hull graph may include fewer edges than a complete convex-hull graph.

Figure 11:
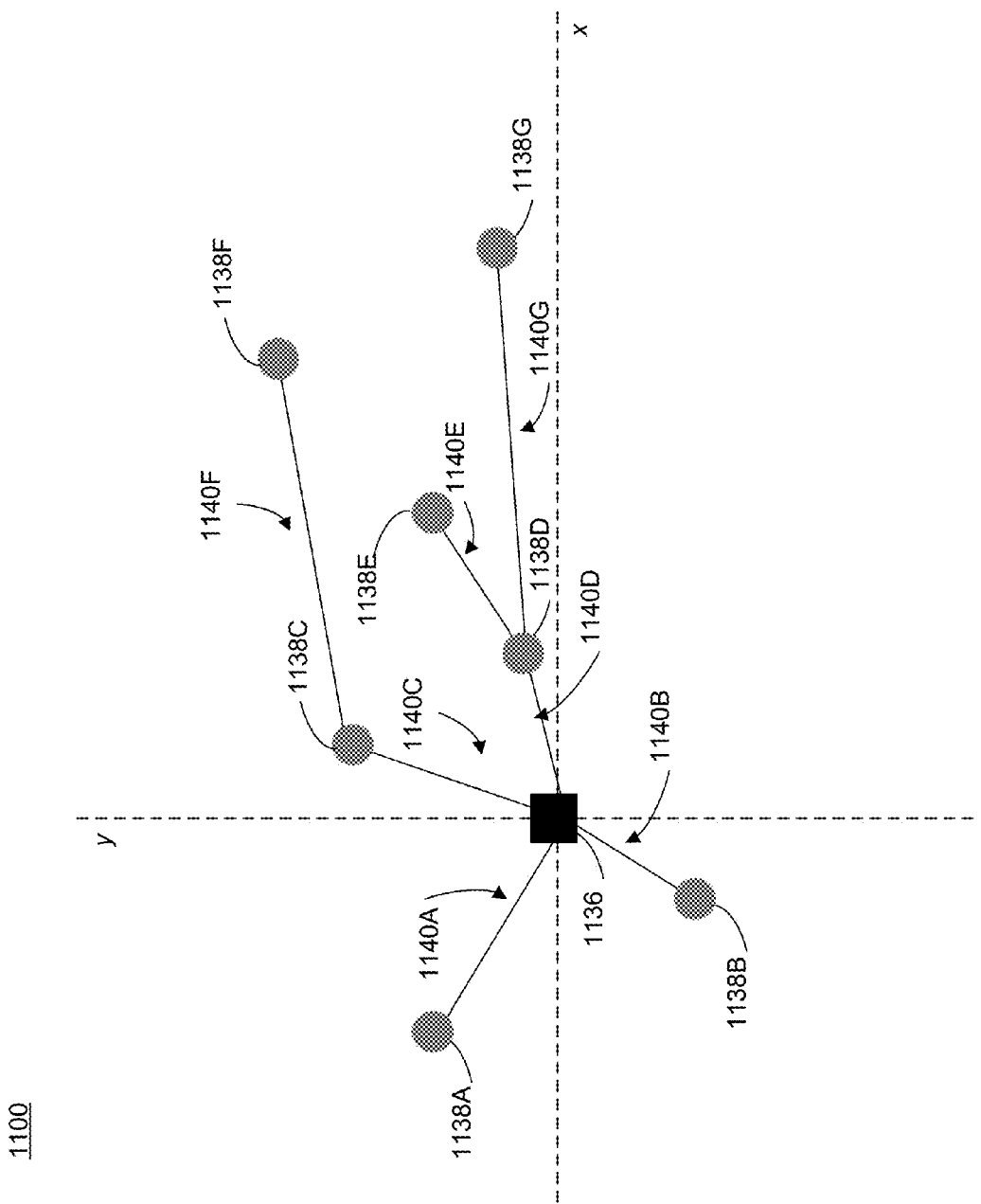
FIG. 11 is a schematic depicting a routing graph in accordance with an embodiment of the present disclosure.
Figure 12:
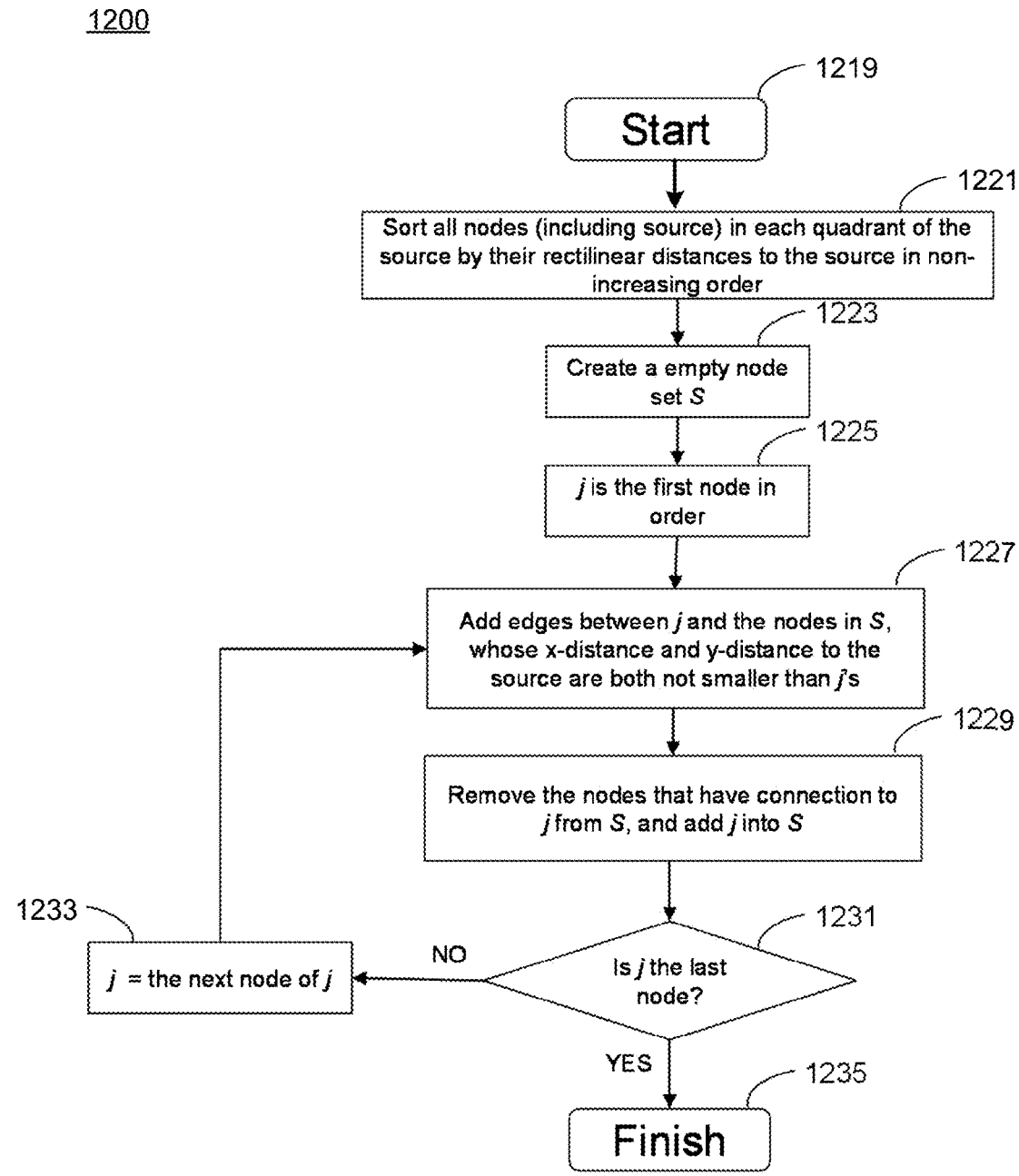
FIG. 12 is a flowchart depicting operations consistent with the spanning tree construction process of the present disclosure.

An example function 1000 of spanning tree construction process 10 may start 1001 and sort 1003 the plurality of nodes by the x-coordinate in a non-decreasing order. In some embodiments, the x-value may be determined by the x-coordinate of each node. In some embodiments, the plurality of nodes may be sorted by one or more quadrants relative to the source node. For example and referring also to FIG. 11, a Cartesian plane may be defined with an origin at the source 1136. Function 1000 may sort the source and the nodes 1138D, 1138E, 1138F, and 1138G because they are in the first quadrant of the source 1136. Additionally and/or alternatively, function 1000 may sort the source 1136 and node 1138A because node 1138A is in a separate quadrant from the other nodes shown in FIG. 11. Function 1000 may create 1005 an empty node set S. Function 1000 may define 1007 j as the first node in the order of the nodes. Function 1000 may find 1009 a node from the node set S whose y-distance from the source to S is smaller than j's y-distance from the source to S. An edge may be added between j and each node found. Function 1000 may add 1011 j into the node set S. In some embodiments, function 1000 may determine 1013 if j is the last node in the order of nodes. If j is not the last node, function 1000 may define 1015 j as the next node in the order of nodes and continue from action 1009. If j is the last node, the function may finish 1017. An exemplary partial convex-hull graph is shown in FIG. 11.

Figure 13:
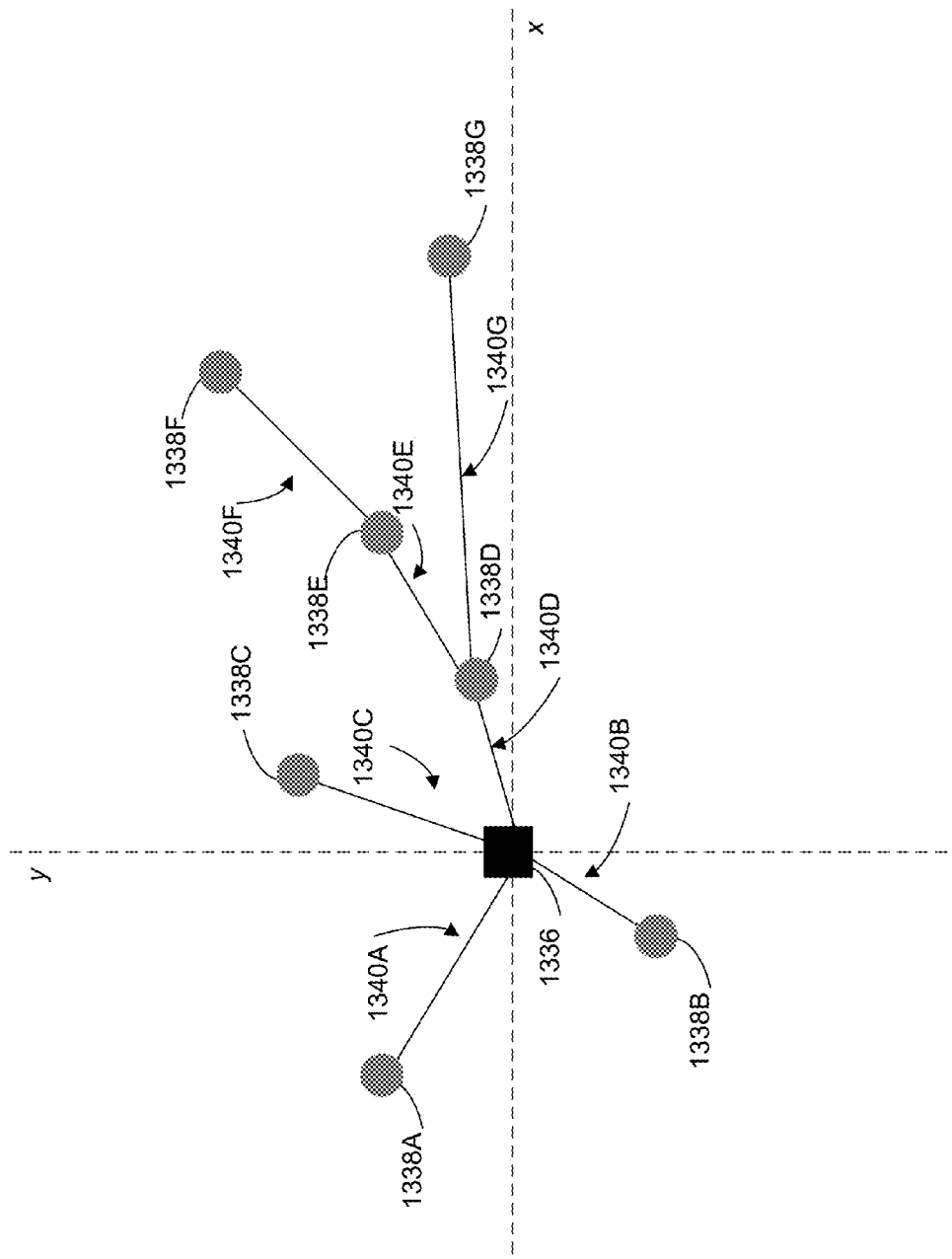
FIG. 13 is a schematic depicting a routing graph in accordance with an embodiment of the present disclosure.

The following is a non-limiting example of an implementation of one or more features and/or functions of spanning tree construction process 10 for generating a partial convex-hull graph. Other implementations may be used within the scope of the present disclosure.
forEach quadrant Q of the source
Sort all the nodes in Q by their x-distance to source in non-decreasing order
   Node Set SS=source
   forEach node p in Q in order
   ParentNode<=Find a node in SS, whose y-distance to source is smaller than the y-distance from p to source
   Create an edge from p to ParentNode
   Inset p into SS
   End forEach
End forEach In some embodiments, and as shown in the example flowchart of FIG. 12, spanning tree construction process 10 may generate a minimum wirelength shortest path tree (MW-SPT). A "MW-SPT" as used herein may include, but is not limited to, a routing graph where every node in the routing graph has a path from itself to the source without detour and with the shortest total wirelength. An example function 1200 of spanning tree construction process 10 may start 1219 and sort 1221 the plurality of nodes according to their rectilinear distances to the source in an non-increasing order. In some embodiments, the plurality of nodes may be sorted by one or more quadrants relative to the source node. For example and referring also to FIG. 13, a Cartesian plane may be defined with an origin at the source 1336. Function 1200 may sort the source 1336 and the nodes 1338D, 1338E, 1338F, and 1338G because they are in the first quadrant of the source 1336. Additionally and/or alternatively, function 1200 may sort the source and node 1338A because node 1338A is in a separate quadrant from the other nodes shown in FIG. 13. Function 1200 may create 1223 an empty node set S. Function 1200 may define 1225 j as the first node in the order of the nodes. Function 1200 may add 1227 one or more edges between j and the nodes in the node set S whose x-coordinates and y-coordinates are both greater than the x-coordinates and y-coordinates of j. In other words, one or more edges mays be added between j and a node, in the node set S, whose x-distance and y-distance to the source are both not smaller than j's. Function 1200 may remove 1229 the nodes from the node set S that are intercoupled with j and add j into the node set S. In some embodiments, the node set S may be sorted by the x-coordinate of each node within the set. In some embodiments, function 1200 may determine 1231 if j is the last in the order of nodes. If j is not the last node, function 1200 may define 1233 j as the next node in the order of nodes and continue from action 1227. If j is the last node in the order of nodes, function 1200 may finish 1235. An exemplary MW-SPT is shown in FIG. 13.

The following is a non-limiting example of an implementation of one or more features and/or functions of spanning tree construction process 10 for generating an MW-SPT. Other implementations may be used within the scope of the present disclosure.
forEach quadrant Q of the source
Sort all the nodes (including source) in Q by their rectilinear distances to the source in non-increasing order
   Node Set S=NULL;
   forEach node p in Q in order
   Create edges from p to every node in S whose x-distance and y-distance to the source are both not smaller than p's, and then remove these nodes from S.
   Insert p into S
   End forEach
End forEach In some embodiments, the routing graph may include one or more of a minimum spanning tree graph, a convex-hull graph, a partial convex-hull graph, and a MW-SPT. In some embodiments, spanning tree construction process 10 may generate one or more of the minimum spanning tree graph, the convex-hull graph, the partial convex-hull graph, and the MW-SPT based upon at least in part the user-defined value. In some embodiments, the routing graph may include the convex-hull graph when the user-defined value is greater than the number of the plurality of nodes and may include one or more of: the minimum spanning tree graph, the partial convex-hull graph, and the MW-SPT when the user-defined value is less than or equal to the number of the plurality of nodes. Generating one or more routing graphs may include combining one or more routing graphs together.

In one example, spanning tree construction process 10 may include generating a minimum spanning tree graph and generating a partial convex-hull graph and/or a MW-SPT. Spanning tree construction process 10 may generate the minimum spanning tree graph and add edges from the partial convex-hull graph and/or the MW-SPT to the routing graph. In other words, a minimum spanning tree graph may minimize total wirelength but may not account for other factors (e.g., detour costs) when the routing graph is used to generate a spanning tree. However, by adding edges from a partial convex-hull graph and/or a MW-SPT, the routing graph may be used to generate a spanning tree that considers more than, for example, wirelength. Additionally and/or alternatively, a partial-convex hull graph may be generated which may account for detour costs but may not account for total wirelength. By combining one or more routing graphs and/or adding edges from one or more routing graphs, a spanning tree may be generated that balances wirelength and detour costs. The combination of one or more routing graphs (e.g., minimum spanning graph, complete convex-hull graph, partial convex-hull graph, and/or MW-SPT) may be a hybrid routing graph.

In some embodiments, the one or more combinations of edges may have fewer edges than the number of the plurality of nodes squared. In some embodiments, regardless of the combination of different routing graphs, spanning tree construction process 10 may reduce the number of edges in the routing graph to less than the number of the plurality of nodes squared. As described above, the complete routing graph may include $n^2$ edges where n is the number of nodes in the plurality of nodes. In some embodiments, by generating a routing graph with a subset of the one or more combinations of edges, spanning tree construction process 10 may generate a routing tree with fewer edges than the number of the plurality of nodes squared.

In some embodiments, spanning tree construction process 10 may include generating a spanning tree based upon, at least in part, at least one of: one or more wirelengths of the routing graph and one or more source-sink detour costs associated with the routing graph. In some embodiments, spanning tree construction process 10 may generate a spanning tree with an algorithm. Examples of algorithms that may generate spanning trees include, but are not limited to, Prim's algorithm, Dijkstra's algorithm, the Prim-Dijkstra algorithm, and other algorithms that may generate spanning trees within the scope of the present disclosure. Examples of spanning trees that may be generated may include, but are not limited to, timing-driven and/or performance driven spanning trees, Steiner trees, rectilinear Steiner trees (RSTs), Rectilinear Steiner Minimum Trees (RSMTs), Minimum Rectilinear Steiner Arborescence (MRSA), Bounded Radius-Ratio Steiner Minimum Trees (BRSMTs), Critical-Sink Routing Trees (CSRTs), Elmore Routing Trees (ERTs), and any spanning tree within the scope of the present disclosure.

In some embodiments, spanning tree construction process 10 may generate the spanning tree based upon, at least in part, at least one of: one or more wirelengths of the routing graph and one or more source-sink detour costs associated with the routing graph. The cost of a routing graph may include but is not limited to, the sum of the costs of each edge of the one or more edges of the routing graph. The cost of each edge may include, but is not limited to, the wirelength of each edge. A "wirelength" as used herein may include, but is not limited to, the distance between one or more sinks. The distance between one or more sinks may include, but is not limited to, the Manhattan and/or rectilinear distance between the one or more sinks. A "source-sink detour cost" as used herein may include, but is not limited to, the distance between the source and the sink furthest from the source of a spanning tree.

In some embodiments, spanning tree construction process 10 may generate a spanning tree $T=(V_T, E_T)$ based upon, at least in part, a routing graph $G=(V_G, E_G)$. In some embodiments, $V_T$ and $E_T$ may be vertices and edges in spanning tree T, respectively (i.e., V may be associated with vertices or sinks and E may be associated with edges). $V_G$ and $E_G$ may be vertices and edges in routing graph G, respectively. In some embodiments, the spanning tree $V_T$ may have some or all of the same vertices of the routing graph $V_G$, ($V_T=V_G$). In some embodiments, the spanning tree $E_T$ may have some or all of the edges of the directed routing graph $E_G$, ($E_T \subset E_G$). The vertices of the routing graph $V_G$ may include a source node s, $s \in V_G$. The routing graph may also include one or more sink nodes v, ($v \in V_G$ and $v \neq s$). For every sink node, there may exist a directed source-to-sink path (SS-Path) in T. A spanning tree with a directed source-to-sink path for each sink node may be a source-to-sink tree.

Figure 14A:
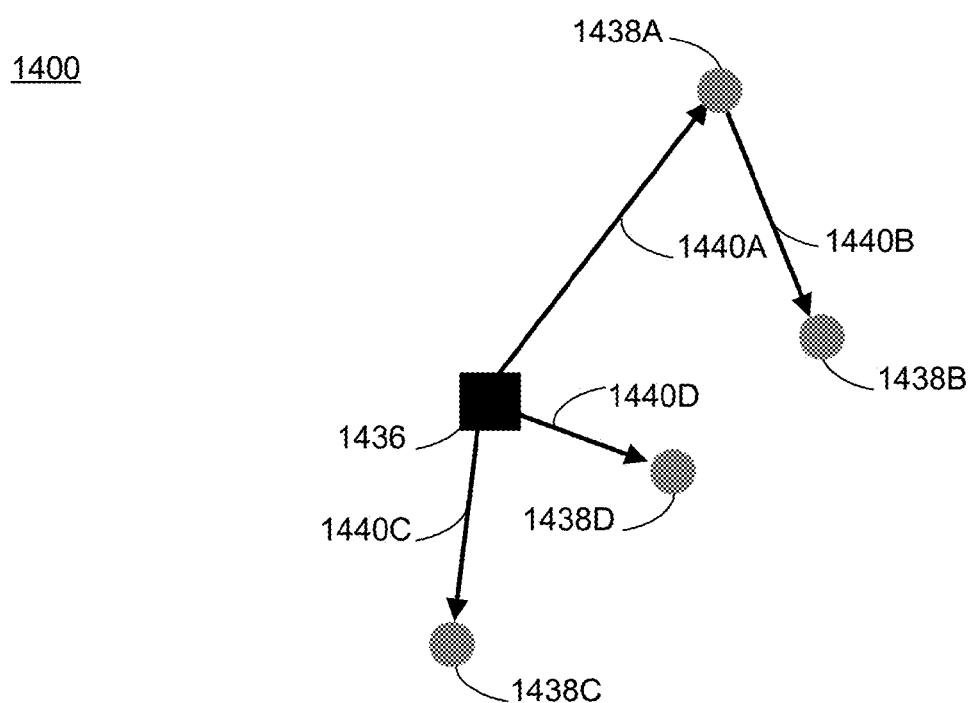
FIG. 14A is a schematic depicting a spanning tree in accordance with an embodiment of the present disclosure.

As shown in the example of FIG. 14A, a spanning tree may include a source 1436, one or more sinks 1438A, 1438B, 1438C, 1438D and one or more edges 1440A, 1440B, 1440C, 1440D to link the one or more sinks 1438A, 1438B, 1438C, 1438D and/or the source 310. The wirelength of edge 1440A between the source 1436 and sink 1438A may be 8. The wirelength of edge 1440B between sink 1438A and sink 1438B may be 5. The wirelength of edge 1440C between the source 1436 and sink 1438C may be 4. The wirelength of edge 1440D between sink 1438A and sink 1438D may be 3. As described above, the cost of each edge may be the wirelength and the cost of the spanning tree may be the cost of each edge of the spanning tree. In this example, the cost of spanning tree may be 20 (e.g., 8+5+4+3). The source-sink detour cost of the spanning tree may be the distance between the source 1436 and the furthest sink. In this example, the source-sink detour cost may be the distance of edges 1440A and 1440B between the source 1436 and sink 1438B, which may be 13 (e.g., 8+5).

Figure 14B:
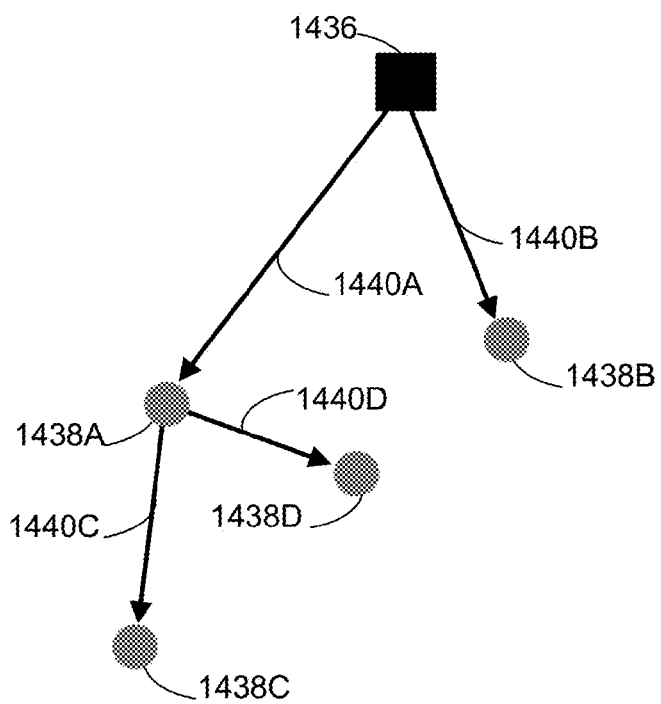
FIG. 14B is a schematic depicting a spanning tree in accordance with an embodiment of the present disclosure.

In another example and as shown in FIG. 14B, a spanning tree may include a source 1436, one or more sinks 1438A, 1438B, 1438C, 1438D and one or more edges 1440A, 1440B, 1440C, 1440D to link the one or more sinks and/or the source 1436. The wirelength of edge 1440A between the source 1436 and sink 1438A may be 8. The wirelength of edge 1440B between the source 1436 and sink 1438B may be 5. The wirelength of edge 1440C between the source 1436 and sink 1438C may be 4. The wirelength of edge 1440D between sink 1438A and sink 1438D may be 3. As described above, the cost of each edge may be the wirelength and the cost of the spanning tree may be the cost of each edge of the spanning tree. In this example, the cost of spanning tree may be 20 (e.g., 8+5+4+3). The radius of the spanning tree may be the distance between the source 1436 and the furthest sink. In this example, the radius may be the distance of edges 1440A and 1440C between the source 1436 and sink 1438C, which may be 12 (e.g., 8+4).

In some embodiments, spanning tree construction process 10 may include receiving a user-selected floating parameter. In some embodiments, the user-selected floating parameter ($\alpha$) may be a given weight value. For a given user-selected floating parameter, spanning tree construction process 10 may generate a spanning tree to avoid wasted wirelength and/or additional detour. In some embodiments, the user-selected floating parameter ($\alpha$) may be between 0 and 1. The total detour and total wirelength of the tree may be traded off by the user specified floating parameter $\alpha$ between 0 and 1. In some embodiments, when $\alpha$ is 0, spanning tree construction process 10 may generate a minimum spanning tree (MST). A minimum spanning tree, as used herein, may include but is not limited to a spanning tree with a minimum wirelength. When $\alpha$ is 1, spanning tree construction process 10 may find a shortest-path tree (SPT). An SPT as used herein may include, but is not limited to, a spanning tree with a minimum source-sink detour cost.

A user and/or an EDA application may select the user-selected floating parameter based upon, at least in part, the tradeoff between increasing the wirelength in order to reduce source-sink distance and vice versa. The user-selected floating parameter may be stored as a default value, may be received from a graphical user interface, and/or may be received by any other suitable method from any source. For example, a user-selected floating parameter may be set to a default of 0.

In some embodiments, spanning tree construction process 10 may generate a MW-SPT based upon, at least in part, the user-selected floating parameter. In one example and referring again to FIG. 3, generating a routing graph may include generating 316 a minimum spanning tree graph. Spanning tree construction process 10 may also include receiving a user-specified floating parameter. In some embodiments, when α is 1, spanning tree construction process 10 may include generating/adding edges 328 for a MW-SPT. The spanning tree generated from the MW-SPT may have a time complexity of O(n log n).

In some embodiments, the spanning tree may have a time complexity of less than or equal to O(n log n). As discussed above, generating a routing tree may include a subset of the one or more combinations of edges and the subset may include n edges, where n may be the number of nodes in the plurality of nodes. One example of a routing graph with O(n) edges may be a partial convex-hull graph. In some embodiments, a spanning tree may have a time complexity of O(e log e), where e may be the number of edges in a routing graph. In some embodiments, spanning tree construction process 10 may generate a spanning tree with an O(n log n) time complexity based upon, at least in part, a routing graph with O(n) edges.

As discussed above, the combination of one or more routing graphs (e.g., minimum spanning graph, complete convex-hull graph, partial convex-hull graph, and/or MW-SPT) may be a hybrid routing graph. In some embodiments, using a hybrid routing graph may allow a spanning tree to be generated with O(n log n) time complexity. For example, a minimum spanning tree graph may generate a routing graph with minimal wirelength, but as the user-selected floating parameter (e.g., a) increases to one, the routing graph with minimal wirelength may have a more detours than the hybrid routing graph.

In some embodiments, spanning tree construction process 10 may generate a MW-SPT with a time complexity of less than or equal to O(n log n). In some embodiments utilizing the spanning tree construction process 10 for generating wirelength/source-sink ratio balanced spanning trees, an increase in construction speed of 10× to 100× may be observed.

In some embodiments of the present disclosure, spanning tree construction process 10 may more quickly produce spanning trees with reduced wirelength and/or lower detour costs. In one example, reducing the wirelength and/or the radius of a spanning tree in the context of integrated circuit design may reduce signal delays and capacitance in an integrated circuit.

Spanning tree construction process 10 may be configured to operate with various EDA applications such as those available from the Assignee of the present disclosure, which may allow the user to evaluate a spanning tree associated with an integrated circuit design. In some embodiments, spanning tree construction process 10, when configured to operate with EDA application 20, may construct a spanning tree from a plurality of nodes associated with an integrated circuit design. The spanning tree may be constructed to balance wirelengths and source-sink detour costs and to increase data throughput for the integrated circuit design. In some embodiments, the plurality of nodes may be received at a graphical user interface associated with the EDA application 20. In some embodiments, the user-defined value and the user-selected floating parameter may be received at a graphical user interface associated with EDA application 20.

In some embodiments, EDA application 20 may support a variety of languages and/or standards. Some of these may include, but are not limited to, IEEE-standard languages, the Open Verification Methodology (OVM), the emerging Accellera Universal Verification Methodology (UVM), and the e Reuse Methodology (eRM). EDA application 20 may support e, Open Verification Library (OVL), OVM class library, emerging UVM class library, SystemC®, SystemC Verification Library, SystemVerilog, Verilog®, VHDL, PSL, SVA, CPF, as well as numerous other languages. EDA application 20 may be used in accordance with mixed-language, mixed-signal, and low-power designs, across multiple levels of abstraction, and may include the ability to "hot swap" the RTL simulation in/out of numerous accelerators/emulators.

As used in any embodiment described herein, the terms "circuit" and "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof. Embodiments of the present disclosure may be incorporated in whole or in part into any design tools.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations of the present disclosure may be written in an object oriented programming language such as Java, Smalltalk, C++ or the like. However, the computer program code for carrying out operations of the present disclosure may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method for constructing a spanning tree in an integrated circuit design comprising:

receiving, using at least one processor, a plurality of nodes associated with the integrated circuit design, wherein the plurality of nodes are configured to be intercoupled by one or more combinations of edges;

receiving a user-specified floating parameter at a graphical user interface;

generating a routing graph with a subset of the one or more combinations of edges based upon, at least in part, the user-specified floating parameter and the position of each of the plurality of nodes;

generating a spanning tree based upon, at least in part, at least one of: one or more wirelengths of the routing graph and one or more source-sink detour costs associated with the routing graph; and applying the spanning tree in the electronic design of an integrated circuit to be fabricated.

2. The computer-implemented method of claim 1, wherein the routing graph is one or more of a minimum spanning tree graph, a convex-hull graph, a partial convex-hull graph, and a minimum wirelength shortest path tree (MW-SPT).

3. The computer-implemented method of claim 2, wherein the routing graph is the convex-hull graph when the user-defined value is greater than the number of the plurality of nodes and is one or more of: the minimum spanning tree graph, the partial convex-hull graph and the MW-SPT when the user-defined value is less than or equal to the number of the plurality of nodes.

4. The computer-implemented method of claim 1, wherein generating the spanning tree is further based upon, at least in part, the user-specified floating parameter.

5. The computer-implemented method of claim 1, wherein the subset of the one or more combinations of edges has fewer edges than the number of the plurality of nodes squared.

6. The computer-implemented method of claim 1, wherein the spanning tree has a time complexity of less than or equal to O(n log n), wherein n corresponds with a number of edges.

7. The computer-implemented method of claim 6, wherein the spanning tree is a minimum wirelength shortest path tree.

8. A system for constructing a spanning tree in an integrated circuit design comprising:

a computing device having at least one processor configured to receive a plurality of nodes associated with the integrated circuit design, wherein the plurality of nodes are configured to be intercoupled by one or more combinations of edges, receive a user-specified floating parameter at a graphical user interface, generate a routing graph with a subset of the one or more combinations of edges based upon, at least in part, the user-specified floating parameter and the position of each of the plurality of nodes, and generate a spanning tree based upon, at least in part, at least one of: one or more wirelengths of the routing graph and one or more source-sink detour costs associated with the routing graph, the at least one processor further configured to apply the spanning tree in the electronic design of an integrated circuit to be fabricated.

9. The system of claim 8, wherein the routing graph is one or more of a minimum spanning tree graph, a convex-hull graph, a partial convex-hull graph, and a MW-SPT.

10. The system of claim 8, wherein the routing graph is a minimum wirelength shortest path tree (MW-SPT).

11. The system of claim 8, wherein the routing graph is the convex-hull graph when the user-defined value is greater than the number of the plurality of nodes and is one or more of the partial convex-hull graph and the MW-SPT when the user-defined value is less than or equal to the number of the plurality of nodes.

12. The system of claim 8, wherein generating the spanning tree is further based upon, at least in part, the user-specified floating parameter.

13. The system of claim 8, wherein the subset of the one or more combinations of edges has fewer edges than the number of the plurality of nodes squared.

14. The system of claim 8, wherein the spanning tree has a time complexity of less than or equal to O(n log n), wherein n corresponds with a number of edges.

15. The system of claim 14, wherein the spanning tree is a minimum wirelength shortest path tree.

16. A computer-implemented method for constructing a spanning tree comprising:
  receiving, using at least one processor, a plurality of nodes, wherein the plurality of nodes are configured to be intercoupled by one or more combinations of edges;
  receiving a user-defined value;
  generating a routing graph with a subset of the one or more combinations of edges based upon, at least in part, the user-defined value and the position of each of the plurality of nodes, wherein the routing graph is a convex-hull graph when the user-defined value is greater than a number of the plurality of nodes and is one or more of a partial convex-hull graph and a minimum wirelength shortest path tree MW-SPT when the user-defined value is less than or equal to the number of the plurality of nodes;
  generating a spanning tree based upon, at least in part, the routing graph; and
  applying the spanning tree in the electronic design of an integrated circuit to be fabricated.

17. The computer-implemented method of claim 16, wherein generating the spanning tree is further based upon, at least in part, at least one of: one or more wirelengths of the routing graph and one or more source-sink detour costs associated with the routing graph.

* * * * *